United States Patent

Soejima et al.

[11] Patent Number: 5,936,845
[45] Date of Patent: Aug. 10, 1999

[54] IC PACKAGE AND IC PROBE CARD WITH ORGANIC SUBSTRATE

[75] Inventors: Koji Soejima; Nobuaki Takahashi; Naoji Senba; Yuzo Shimada, all of Toyko, Japan

[73] Assignee: NEC Corporation, Tokyo, Japan

[21] Appl. No.: 08/880,390

[22] Filed: Jun. 23, 1997

[30] Foreign Application Priority Data

Jun. 24, 1996 [JP] Japan .................................. 8-162609

[51] Int. Cl.⁶ .......................... H01L 23/48; G01R 31/02; H05K 7/02
[52] U.S. Cl. ........................ 361/767; 361/774; 257/697; 257/737; 438/613; 324/755; 324/757
[58] Field of Search ..................... 361/748, 767, 361/768, 772, 774, 777; 257/737, 692, 697; 438/613; 439/66; 324/754–758, 538, 72.5

[56] References Cited

U.S. PATENT DOCUMENTS

| | | | |
|---|---|---|---|
| 4,707,657 | 11/1987 | Boegh-Petersen | 439/66 |
| 4,954,458 | 9/1990 | Reid | 438/109 |
| 5,012,187 | 4/1991 | Littlebury | 324/754 |
| 5,055,780 | 10/1991 | Takagi et al. | 324/765 |
| 5,177,439 | 1/1993 | Liu et al. | 324/754 |
| 5,401,689 | 3/1995 | Frei et al. | 29/830 |
| 5,434,452 | 7/1995 | Higgins, III | 257/737 |
| 5,476,818 | 12/1995 | Yanof et al. | 29/832 |
| 5,477,160 | 12/1995 | Love | 439/66 |
| 5,657,207 | 8/1997 | Schreiber et al. | 361/772 |
| 5,677,575 | 10/1997 | Maeta et al. | 257/778 |
| 5,759,047 | 6/1998 | Brodsky et al. | 439/66 |
| 5,790,377 | 8/1998 | Schreiber et al. | 257/737 |
| 5,808,875 | 9/1998 | McMahon et al. | 439/66 |
| 5,831,444 | 11/1998 | Pai | 324/758 |

FOREIGN PATENT DOCUMENTS

| | | |
|---|---|---|
| 63-220533 | 9/1988 | Japan . |
| 2-161739 | 6/1990 | Japan . |
| 3-219650 | 9/1991 | Japan . |
| 7-78645 | 3/1995 | Japan . |
| 8-32183 | 2/1996 | Japan . |
| WO 96/15458 | 5/1996 | WIPO . |

Primary Examiner—Leo P. Picard
Assistant Examiner—John B. Vigushin
Attorney, Agent, or Firm—Young & Thompson

[57] ABSTRACT

An IC package includes an IC chip substrate having a first surface on which a plurality of electrodes are formed, and an organic substrate having a first surface on which a plurality of bump electrodes are provided. The organic substrate is combined with the IC chip substrate. Each of the bump electrodes is in contact with a corresponding one of the electrodes on the IC chip substrate. The organic substrate has a plurality of through holes and metallization patterns electrically connecting each of the bump electrodes to a corresponding one of the through holes.

16 Claims, 5 Drawing Sheets

IC PACKAGE AND IC PROBE CARD WITH ORGANIC SUBSTRATE

BACKGROUND OF THE INVENTION

The present invention relates to improved IC package, IC prober and connector as well as method of fabricating the same.

FIG. 1 is a schematic view illustrative of a conventional tungsten probe comprising a large number of tungsten pins 142, which are supported by a first supporter 143 at a first side and by a second supporter 144 at a second side. The tungsten pins 142 are aligned so as to have a first pitch at the first side and a second pitch at the second side wherein the first pitch is much smaller than the second pitch. The pitch of the tungsten pins 142 remarkably increases toward the second side from the first side. The first pitch of the tungsten pins 142 at the first side is 100 micrometers, whilst the second pitch of the tungsten pins 142 at the second side is a few millimeters which is larger by 20–30 times than the first pitch.

The above tungsten probe has the following disadvantages. Each of the tungsten pins 142 has a relatively large length. This causes a deterioration in high frequency performance of the tungsten probe. Since it is required to form each pin separately, this increases manufacturing cost. Further, since the second pitch of the tungsten pins is much wider than the first pitch, a large number of the tungsten pins 142 leads to the problem with spatial limitation.

FIG. 2 is a cross sectional elevation view illustrative of a membrane probe which comprises a polyimide film 156, an elastomer 158 which is provided on a first surface of the polyimide film 156, a supporting substrate 157 provided on the elastomer 158, contacts 159 provided on a second surface of the polyimide film 156 and wirings 160 which extend over the second surface of the polyimide film 156 from the contacts outwardly.

The above membrane probe also has the following problem. It is difficult to obtain contacts with all of the terminals on an area of 10 cm×10 cm or more due to a difference in level between the wafer and probe. It is also difficult to form a large number of wirings connected to a large number of pins due to a limited wiring area. This means it difficult to obtain connections between the probe card and the external device.

FIG. 3 is a schematic plan view illustrative of a conventional DIP mold package which comprises an IC 162, lead frames 163 extending from the IC package 162 outwardly and connected via wire-bonding to the IC 162 and an epoxy resin 164 molding the IC 162 and the lead frames 163.

The above conventional DIP mold package has the following disadvantages. It is difficult to provide external electrodes in the form of ball grid array in the structural viewpoint. If the IC is assembled into the package by a flip-chip bonding method, it is required to form bumps on the IC or substrate or supply solders. This results in increased numbers of the fabrication processes and also increased manufacturing cost. In view of the assembly, a pitch of the electrodes of the package is required to be 500 micrometers or more, for which reason in order to increase the number of electrodes of the IC, it is required to enlarge a package size.

In order to reduce the package size, it was proposed to combine a chip package with the ball grid array Notwithstanding, the wire-bonding, ball bumps and solders are also required.

SUMMARY OF THE INVENTION

Accordingly, it is an object of the present invention to provide a novel IC package free from the above disadvantages.

It is a further object of the present invention to provide a novel IC package of a low manufacturing cost.

It is a still further object of the present invention to provide a novel IC package of a small size.

It is yet a further object of the present invention to provide a novel IC package of desired electrical characteristics.

It is further more object of the present invention to provide a novel IC prober free from the above disadvantages.

It is moreover object of the present invention to provide a novel IC prober of a large area.

It is still more object of the present invention to provide a novel IC prober of a large number of pins.

It is yet more object of the present invention to provide a novel connector free from the above disadvantages.

It is still further more object of the present invention to provide a novel connector with desirable electrical characteristics.

It is yet further more object of the present invention to provide a novel method of fabricating an IC package free from the above disadvantages.

It is another object of the present invention to provide a novel method of fabricating an IC package of a low manufacturing cost.

It is still another object of the present invention to provide a novel method of fabricating an IC package of a small size.

It is yet another object of the present invention to provide a novel method of fabricating an IC package of desired electrical characteristics.

It is further another object of the present invention to provide a novel method of fabricating an IC prober free from the above disadvantages.

It is still further another object of the present invention to provide a novel method of fabricating an IC prober of a large area.

It is yet further another object of the present invention to provide a novel method of fabricating an IC prober of a large number of pins.

It is an additional object of the present invention to provide a novel method of fabricating a connector free from the above disadvantages.

It is still additional object of the present invention to provide a novel method of fabricating a connector with desirable electrical characteristics.

The present invention provides an IC package comprising an IC chip substrate having a first surface on which a plurality of electrodes are formed, and an organic substrate having a first surface on which a plurality of bump electrodes are provided. The organic substrate is combined with the IC chip substrate. Each of the bump electrodes is in contact with a corresponding one of the electrodes on the IC chip substrate. The organic substrate has a plurality of through holes and metallization patterns electrically connecting each of the bump electrodes to a corresponding one of the through holes.

The present invention also provides an IC probe card comprising a multilevel interconnection substrate, and a plurality of organic substrates provided on the multilevel interconnection substrate. Each of the organic substrates has a first surface on which a plurality of bump electrodes are provided. The organic substrate is combined with the IC chip substrate. Each of the bump electrodes is in contact with a corresponding one of the electrodes on the IC chip substrate. The organic substrate has a plurality of through holes and metallization patterns electrically connecting each of the bump electrodes to a corresponding one of the through holes.

The present invention also provides a connector for electrically connecting first electrode arrays on a first substrate and second electrode arrays on a second substrate. The connector comprises an organic substrate having a first surface on which first bump electrode arrays are provided and a second surface on which second bump electrode arrays are provided. The organic substrate is sandwiched between the first and second substrates so that each of the first bump electrode arrays is in contact with a corresponding one of the first electrode always on the first substrate whilst each of the second bump electrode arrays is in contact with corresponding one of the second electrode arrays on the second substrate. The organic substrate has a plurality of through holes and metallization patterns electrically connecting each of first bump electrode arrays through a corresponding one of the through holes to a corresponding one of the second bump electrode arrays.

BRIEF DESCRIPTIONS OF THE DRAWINGS

Preferred embodiments of the present invention will be described in detail with reference to the accompanying drawings.

Figure 16:
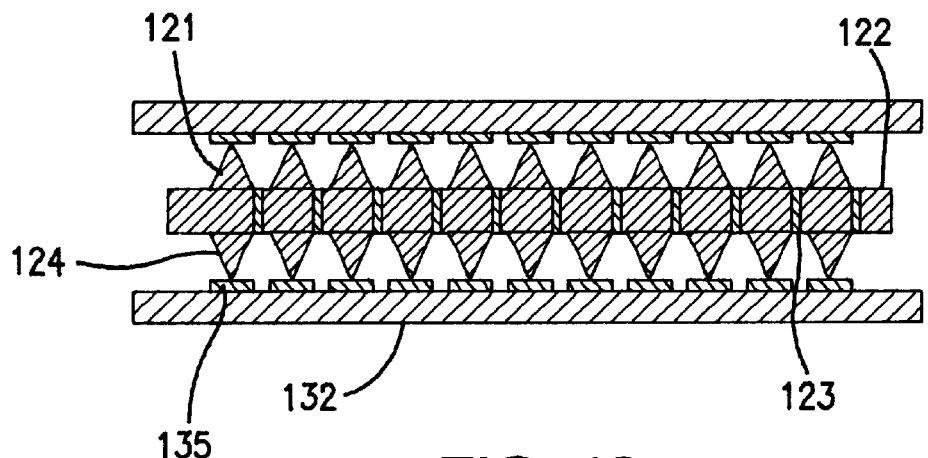

FIG. 16 is a fragmentary cross sectional elevation view illustrative of a connector which comprises an organic substrate having first and second surfaces on which first and second square-pyramid bumps arrays are formed respectively and first and second glass epoxy substrates having first and second electrode arrays which are in contact with the first and second square-pyramid bumps arrays respectively in sixth, seventh and eighth embodiments according to the present invention.

DISCLOSURE OF THE INVENTION

The present invention provides an IC package comprising an IC chip substrate having a first surface on which a plurality of electrodes are formed, and an organic substrate having a first surface on which a plurality of bump electrodes are provided. The organic substrate is combined with an IC chip substrate. Each of the bump electrodes is in contact with a corresponding one of the electrodes on the IC chip substrate. The organic substrate has a plurality of through holes and metallization patterns electrically connecting each of the bump electrodes to a corresponding one of the through holes.

It is preferable that a space between the IC chip substrate and the organic substrate is filled with a sealing resin material.

It is also preferable that each of the bump electrodes has a pyramidal shape.

It is also preferable that each of the bump electrodes comprises a bump body which is made of the same material as the organic substrate and a metal film coating the bump body.

It is also preferable that the bump electrodes are aligned to form a rectangle having four sides, each of which comprises an alignment of the bump electrodes, the through holes are aligned outside and along the each side of the rectangle of the bump electrodes and the through holes are distanced from the bump electrodes and the metallization patterns provide electrical connections between each of the bump electrodes and the corresponding one of the through holes.

It is also preferable that the bump electrodes are aligned in matrix, the through holes are also aligned in matrix so that each of the through holes is positioned adjacent to the corresponding one of the bump electrodes and the metallization patterns provide electrical connections between each of the bump electrodes and the corresponding one of the through holes. In this case, it is more preferable that the organic substrate has a second surface on which ball grid arrays are provided at positions corresponding to the bump electrodes so that the ball grid arrays are aligned in a matrix and each of the through holes is positioned adjacent to the corresponding one of the ball grid arrays and metallization patterns are further formed on the second surface of the organic substrate so as to provide electrical connections between each of the ball grid arrays and the corresponding one of the through holes.

It is also preferable that the organic substrate is made of ABS resin.

It is also preferable that the organic substrate is made of liquid crystal polymer resin.

It is also preferable that the organic substrate is made of elastomer.

The present invention also provides an IC probe card comprising a multilevel interconnection substrate, and a plurality of organic substrates provided on the multilevel interconnection substrate. Each of the organic substrates has a first surface on which a plurality of bump electrodes are provided. The organic substrate is combined with the IC chip substrate. Each of the bump electrodes is in contact with a corresponding one of the electrodes on the IC chip substrate. The organic substrate has a plurality of through holes and metallization patterns electrically connecting each of the bump electrodes to a corresponding one of the through holes.

It is preferable that a space between the IC chip substrate and the organic substrate is filled with a sealing resin material.

It is also preferable that each of the bump electrodes has a pyramidal shape.

It is also preferable that each of the bump electrodes comprises a bump body which is made of the same material as the organic substrate and a metal film coating the bump body.

It is also preferable that the bump electrodes are aligned to form a rectangle having four sides, each of which comprises an alignment of the bump electrodes, the through holes are aligned outside and along the each side of the rectangle of the bump electrodes and the through holes are distanced from the bump electrodes and the metallization patterns provide electrical connections between each of the bump electrodes and the corresponding one of the through holes.

It is also preferable that the bump electrodes are aligned in a matrix, the through holes are also aligned in a matrix so that each of the through holes is positioned adjacent to the corresponding one of the bump electrodes and the metallization patterns provide electrical connections between each of the bump electrodes and the corresponding one of the through holes. In this case, it is more preferable that the organic substrate has a second surface on which ball grid arrays are provided at positions corresponding to the bump electrodes so that the ball grid arrays are aligned in a matrix and each of the through holes is positioned adjacent to the corresponding one of the ball grid arrays and metallization patterns are further formed on the second surface of the organic substrate so as to provide electrical connections between each of the ball grid arrays and the corresponding one of the through holes.

It is also preferable that the organic substrate is made of ABS resin.

It is also preferable that the organic substrate is made of liquid crystal polymer resin.

It is also preferable that the organic substrate is made of elastomer.

The present invention also provides a connector for electrically connecting first electrode arrays on a first substrate and second electrode arrays on a second substrate. The connector comprises an organic substrate having a first surface on which first bump electrode arrays are provided and a second surface on which second bump electrode arrays are provided. The organic substrate is sandwiched between the first and second substrates so that each of the first bump electrode arrays is in contact with a corresponding one of the first electrode arrays on the first substrate whilst each of the second bump electrode arrays is in contact with a corresponding one of the second electrode arrays on the second substrate. The organic substrate has a plurality of through holes and metallization patterns electrically connecting each of first bump electrode arrays through a corresponding one of the through holes to a corresponding one of the second bump electrode arrays.

It is preferable that each bump of the first and second bump arrays has a pyramidal shape.

It is also preferable that each of the bump electrodes comprises a bump body which is made of the same material as the organic substrate and a metal film coating the bump body.

It is also preferable that each of the first and second bump arrays are aligned to form a rectangle having four sides, each of which comprises an alignment of bump electrodes, the through holes are aligned outside and along the each side of the rectangle of the bump electrodes and the through holes are distanced from the bump electrodes and the metallization patterns provide electrical connections between each of the bump electrodes and a corresponding one of the through holes.

It is also preferable that bump electrodes of each of the first and second bump arrays are aligned in a matrix, the through holes are also aligned in a matrix so that each of the through holes is positioned adjacent to the corresponding one of the bump electrodes and the metallization patterns provide electrical connections between each of the bump electrodes and the corresponding one of the through holes.

It is also preferable that the organic substrate is made of ABS resin.

It is also preferable that the organic substrate is made of liquid crystal polymer resin.

It is also preferable that the organic substrate is made of elastomer.

The present invention also provides a method of forming an IC package comprising the following steps. A first surface of a silicon wafer is selectively subjected to an etchant for selectively etching the silicon substrate so that pits are formed in the first surface of the silicon wafer. A pin die having a plurality of pins is assembled on the first surface of the silicon wafer so that the pits face to the pin die and the pins extend between the pin die and the first surface of the silicon wafer. Injection molding of an organic resin material is carried out by use of the pin die combined on the silicon wafer to form an organic substrate having a first surface, on which bumps made of the same material as the organic substrate are formed at the corresponding positions to the pits. The organic substrate has through holes at the corresponding positions as the pins. A photo-resist pattern is provided which extends over the organic substrate. The organic substrate is subjected to an electroless plating of a metal to selectively form metallization patterns, each of which extends from the bump to corresponding one of the through holes. The photo-resist film is removed from the organic substrate. A photo-sensitive epoxy resin pattern is provided which extends over the organic substrate except over the bumps. The bumps are subjected to a metal plating to form a metal plating film which coats the bumps. An IC chip with electrodes which have been metal-plated is placed on the organic substrate for bonding the same. A space between the IC chip and the organic substrate is filled with a sealing resin material for subsequent curing the sealing resin material by a heat treatment.

The present invention provides a method of forming an IC probe card comprising the following steps. A first surface of a silicon wafer is selectively subjected to an etchant for selectively etching the silicon substrate so that pits are formed in the first surface of the silicon wafer. A pin die having a plurality of pins is assembled on the first surface of the silicon wafer so that the pits face to the pin die and the pins extend between the pin die and the first surface of the silicon wafer. Injection molding of an organic resin material is carried out by use of the pin die combined on the silicon wafer to form an organic substrate having a first surface, on which bumps made of the same material as the organic substrate are formed at the corresponding positions to the pits. The organic substrate has through holes at the corresponding positions as the pins. A photo-resist pattern is provided which extends over the organic substrate. The organic substrate is subjected to an electroless plating of a metal to selectively form metallization patterns, each of which extends from the bump to corresponding one of the through holes. The photo-resist film is removed from the organic substrate. A photo-sensitive epoxy resin pattern is provided which extends over the organic substrate except over the bumps. The bumps are subjected to a metal plating to form a metal plating film which coats the bumps. At least one of the organic substrates is placed on a multilevel interconnection substrate.

The present invention provides a method of forming an connector comprising the following steps. A first surface of a silicon wafer is selectively subjected to an etchant for selectively etching the silicon substrate so that pits are formed in the first surface of the silicon wafer. Two of the silicon wafer for are used carrying out an injection molding of an organic resin material to form an organic substrate having a first surface, on which first bumps made of the same material as the organic substrate are formed at the corresponding positions to the pits, and a second surface, on which second bumps made of the same material as the organic substrate are formed at the corresponding positions to the pits. Through holes are formed in the organic substrate. A photo-resist pattern is provided which extends over the organic substrate. The organic substrate is subjected to an electroless plating of a metal to selectively form metallization patterns, each of which extends from the first bump through corresponding one of the through holes to corresponding one of the second bumps. The photo-resist film is removed from the organic substrate. A photo-sensitive epoxy resin pattern is provided which extends over the organic substrate except over the bumps. The bumps are subjected to a metal plating to form a metal plating film which coats the bumps. The organic substrate is placed between first and second glass epoxy substrates which have first and second electrode arrays so that the first bumps formed on the first surface of the organic substrate are in contact with the first electrode array of the first glass epoxy substrate whilst the second bumps formed on the second surface of the organic substrate are in contact with the second electrode array of the second glass epoxy substrate for electrically connecting the first electrode array to the second electrode array.

FIRST EMBODIMENT

A first embodiment according to the present invention will be described with reference to FIGS. 4 through 11.

Figure 1:
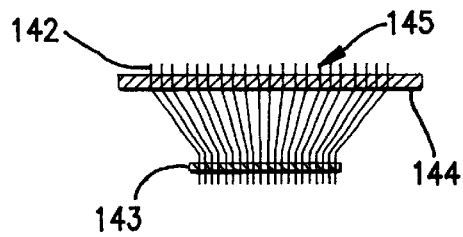
FIG. 1 is a schematic view illustrative of a conventional tungsten probe.
Figure 2:
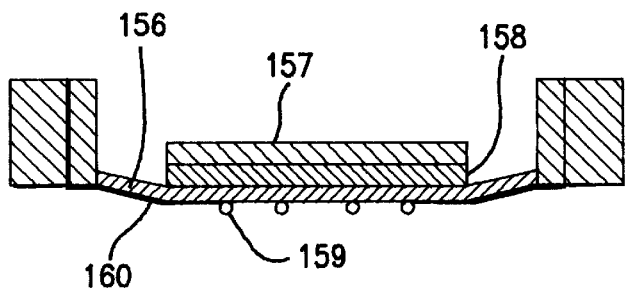
FIG. 2 is a cross sectional elevation view illustrative of a membrane probe.
Figure 3:
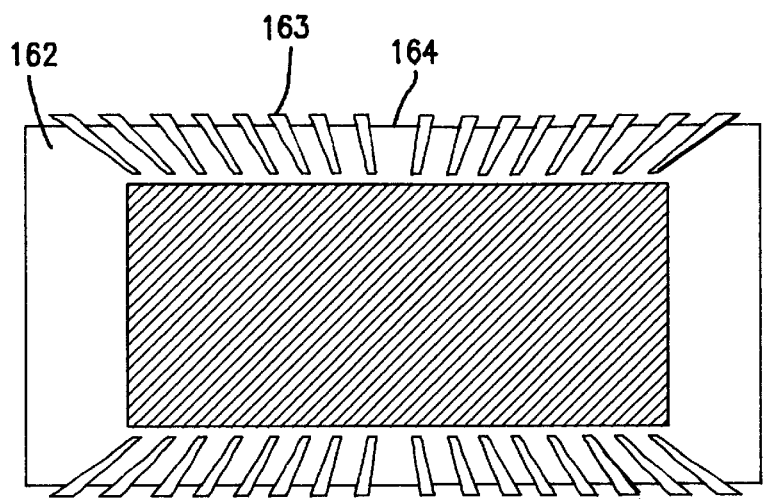
FIG. 3 is a schematic plan view illustrative of a conventional DIP mold package.
Figure 4:
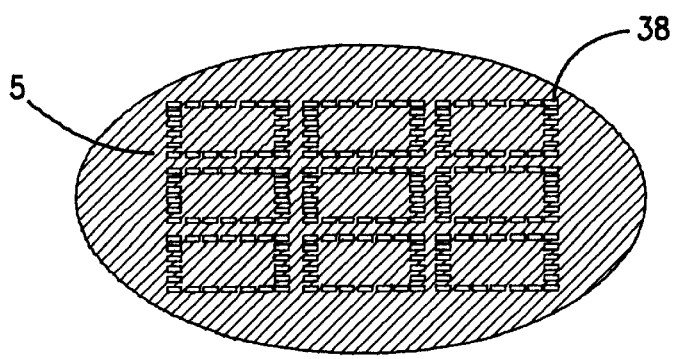
FIG. 4 is a schematic perspective view illustrative of a substrate formed with etch pits in a first embodiment according to the present invention.
Figure 5:
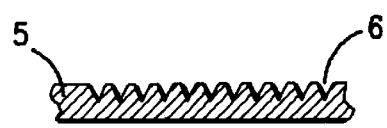
FIG. 5 is a fragmentary cross sectional elevation view illustrative of etch pits formed on a top surface of a substrate in a first embodiment according to the present invention

As illustrated in FIG. 4, a silicon wafer 5 was prepared which has first and second surfaces coated with silicon dioxide films. The silicon wafer 5 has a diameter of 6 inches and a thickness of 1 millimeter. A photo-resist is applied on the silicon wafer 5 and then patterned to form a photo-resist pattern on the silicon wafer 5. By use of the photo-resist pattern, patterns of openings 38 are formed in the silicon wafer 5 so that the openings are aligned in the form of rectangles which are aligned in a matrix separately from each other at a small distance wherein each rectangle has four sides each of which comprises an alignment of the openings. The silicon wafer is then subjected to a hydrofluoric acid solution for 10 minutes. The used photo-resist film is removed from the silicon wafer 5 before the silicon wafer 5 is subjected to a solution containing 30% of potassium hydroxide for 30 minutes so that (111)-faces are shown and square-pyramid pits 6 are formed in the first surface of the silicon wafer 5. Each of the pits 6 has an opening area of 100 $\mu$m×100 $\mu$m at the first surface of the silicon wafer 5 and a depth of 70.8 $\mu$m. The square-pyramid pits 6 are aligned in the form of rectangles which are aligned in matrix separately from each other at a small distance wherein each rectangle has four sides each of which comprises an alignment of the square-pyramid pits 6.

Figure 6:
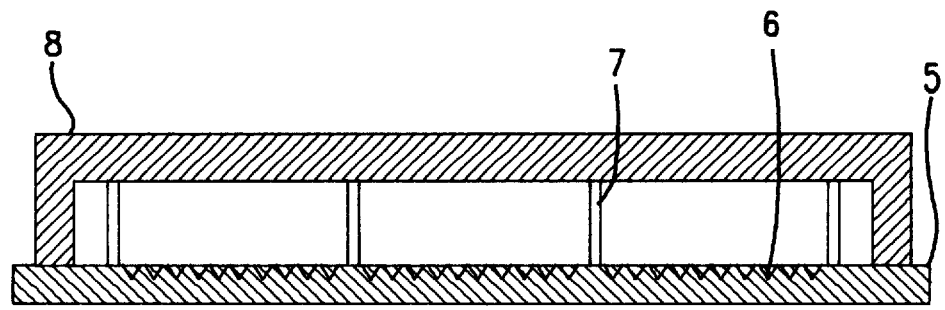
FIG. 6 is a fragmentary cross sectional elevation view illustrative of a die assembly in a first embodiment according to the present invention.
Figure 7:
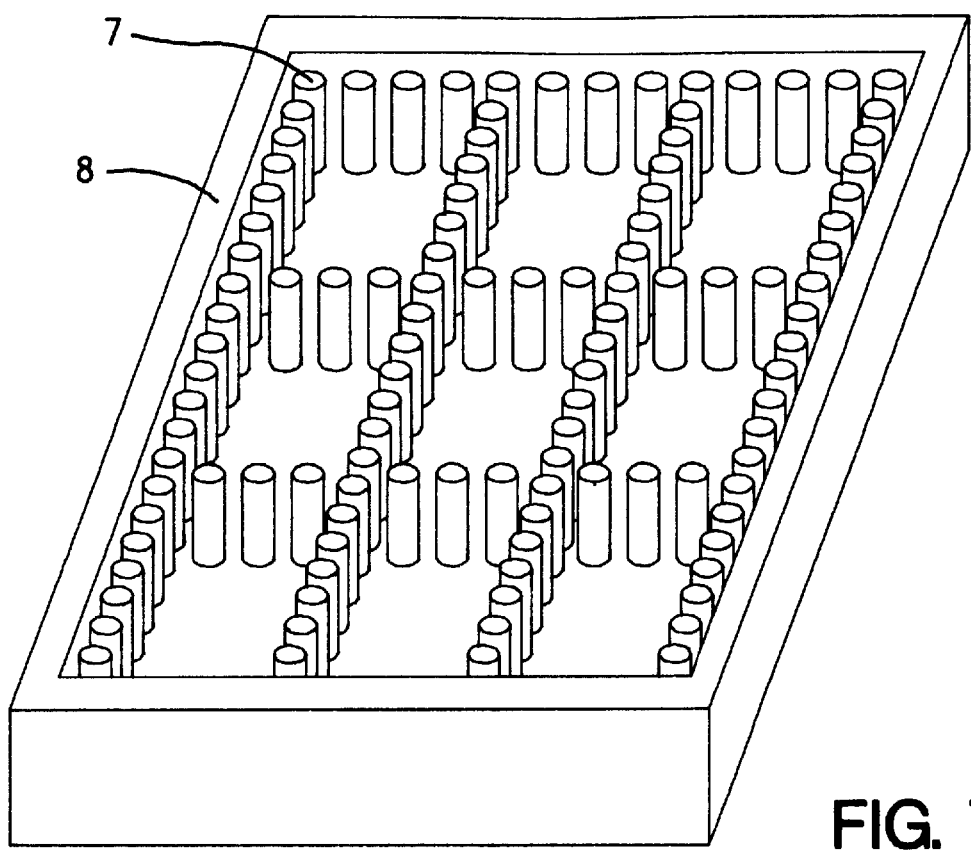
FIG. 7 is a schematic perspective view illustrative of a die assembly in a first embodiment according to the present invention.
Figure 8:
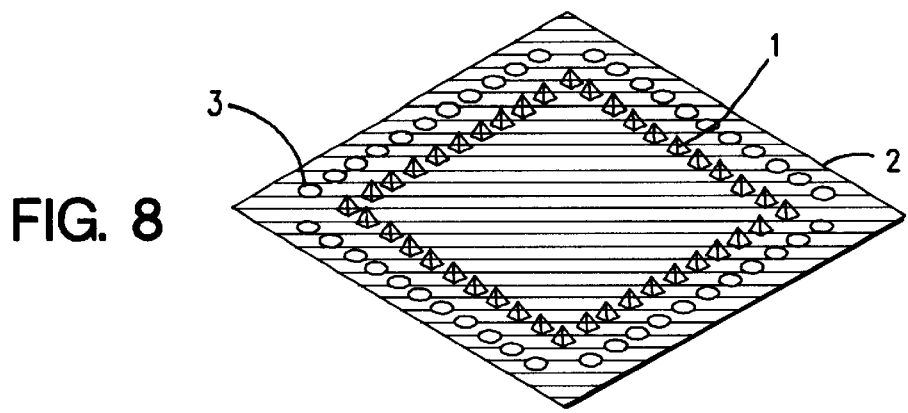
FIG. 8 is a schematic perspective view illustrative of an organic substrate in a first embodiment according to the present invention.
Figure 9:
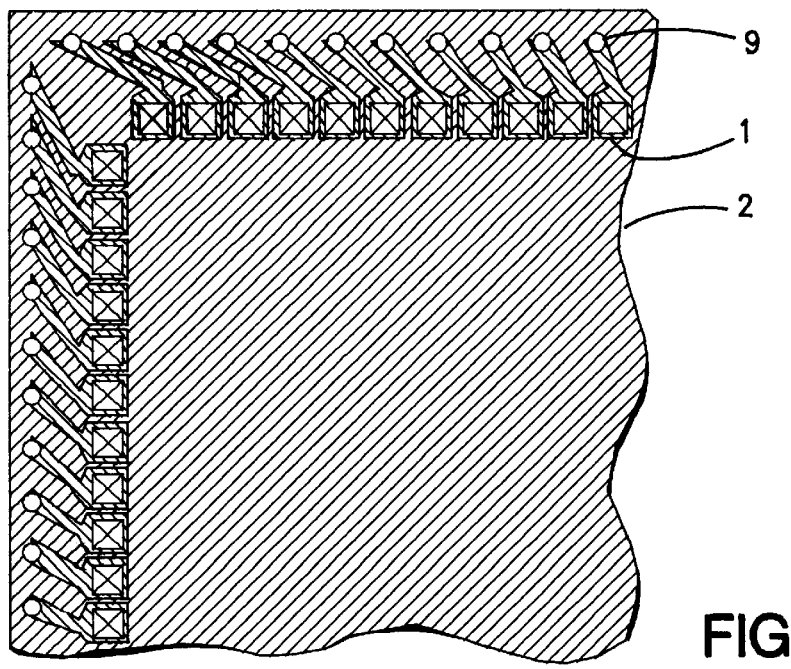
FIG. 9 is a fragmentary plane view illustrative of an organic substrate in a first embodiment according to the present invention.
Figure 10:
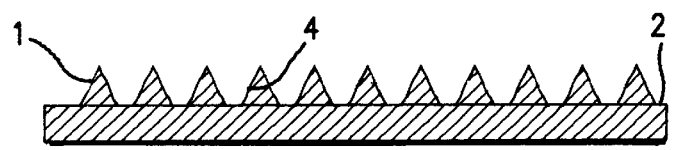
FIG. 10 is a cross sectional elevation view illustrative of square-pyramid bumps aligned on an organic substrate in a first embodiment according to the present invention.

As illustrated in FIG. 6, a pin die 8 is assembled on the first surface of the silicon wafer 5 so that the square-pyramid pits 6 face to the pin die 8. Pins 7 are provided on the pin die 8 so that the pins 7 extend between the pin die 8 and the first surface of the silicon wafer 5. Each of the pins 7 has a diameter of 0.3 millimeters and a length of 1 millimeters. The pins 7 are aligned at a pitch of 0.5 millimeters. As illustrated in FIG. 7, the pins 7 are aligned in the form of rectangles which are aligned in matrix and bounded with each other wherein each rectangle has four sides each of which comprises an alignment of the pins 7. Each side of the rectangle extends between the adjacent parallel sides of the rectangles of the pits 6. The pin die assembly is used for an injection molding of ABS resin so that an organic substrate 2 is formed as illustrated in FIG. 8. The organic substrate 2 has through holes 3 at the same position as the pins 7 and square-pyramid bumps 1 at the same position as the square-pyramid pits 6. The through holes 3 are aligned along each side of the organic substrate 2. The square-pyramid pits 6 are aligned inside the through holes. The existence of the pins 7 results in formation of the through holes 3. Burrs are formed on the organic substrate 2 when the through holes 3 are formed. The burrs are removed by YAG pulse laser. The organic substrate 2 has a thickness of 1 millimeter and a size of 40 mm×40 mm. Each square-pyramid bump 1 has a top slightly rounded. The height of the square-pyramid bump 1 is 60 micrometers. The square-pyramid bumps 1 are aligned at a pitch of 250 micrometers. A surface of the organic substrate 2 is treated by a plasma etcher for 5 minutes. A photo-resist pattern is formed by photo-lithography so that the photo-resist pattern extends over the organic substrate 2 except over regions on which no metallization or wiring is intended to be made. The organic substrate 2 is subjected to an electroless plating of copper to selectively form metallization patterns 9, each of which extends from the square-pyramid bump 1 to the corresponding through hole 3 as illustrated in FIG. 9. The metallization patterns 9 have a thickness of 10 micrometers. The photo-resist film is removed from the surface of the organic substrate 2. A photo-sensitive epoxy resin is applied on the organic substrate 2 and then patterned so that the photo-sensitive epoxy resin pattern extends over the organic substrate 2 except over the square-pyramid bumps 1. The square-pyramid bumps 1 are subjected to a nickel plating and subsequent indium 50 wt %-tin 50 wt % plating to form laminations of a nickel plating film and an indium 50 wt %-tin 50 wt % plating film which coat the square-pyramid bumps 1. The organic substrate 2 is cut and divided into a plurality of substrates, each of which has a single rectangle of the alignments of the square-pyramid bumps 1 and the metallization patterns 9 extending from the square-pyramid bumps 1 through the through holes 3. Each of the substrates is illustrated in FIG. 10.

Figure 11:
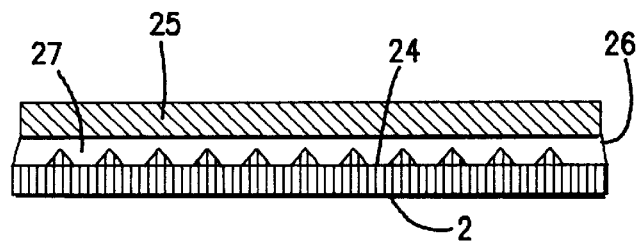
FIG. 11 is a fragmentary cross sectional elevation view illustrative of a connector in a first embodiment according to the present invention.

As illustrated in FIG. 11, an IC chip 25 with electrodes 27 which have been nickel-plated and gold-plated is aligned on the organic substrate 2. The combined IC chip 25 and the organic substrate 2 are then heated at 120° C. and pressed at 20 g for each contact for bonding the same. A space between the combined IC chip 25 and the organic substrate 2 is filled by a dispenser with a sealing resin 26 which comprises 30 wt % of epoxy resin and 70 wt % of silica filler. The combined IC chip 25 and the organic substrate 2 are once heated at 150° C. and then remain for 30 minutes to cure the sealing resin 26. The heating causes melted indium-tin and gold to be inter-diffused whereby a melting point of the metal is increased to prevent the melting of the contact when heated for curing the sealing resin.

It was confirmed that of the IC package a resistance between the wiring of the substrate to the electrode of the IC is extremely low, for example, 10 m Ω or less. The IC package was subjected to a thermal cycle test of 500 times between −40° C. and 125° C. The IC package was not broken.

SECOND EMBODIMENT

Figure 12:
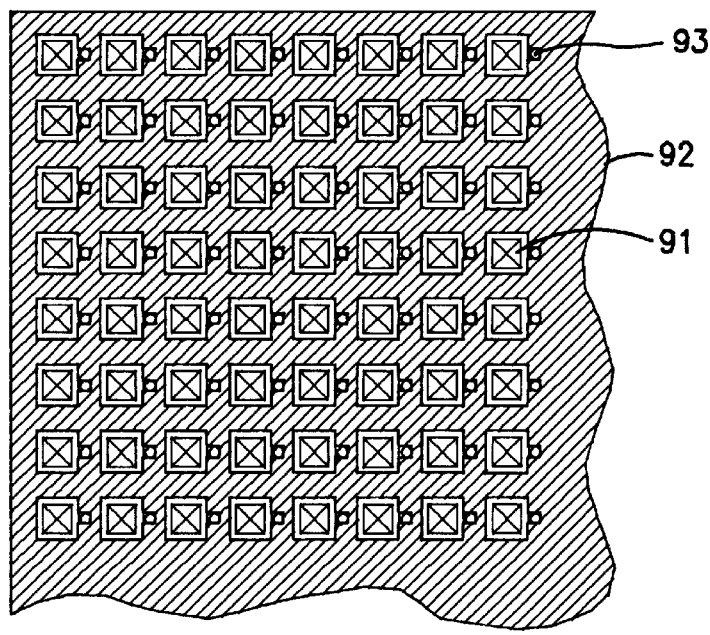
FIG. 12 is a fragmentary plane view illustrative of a first surface of an organic substrate with area bumps aligned in 16×16 matrix over the organic substrate in second and third embodiments according to the present invention.
Figure 13:
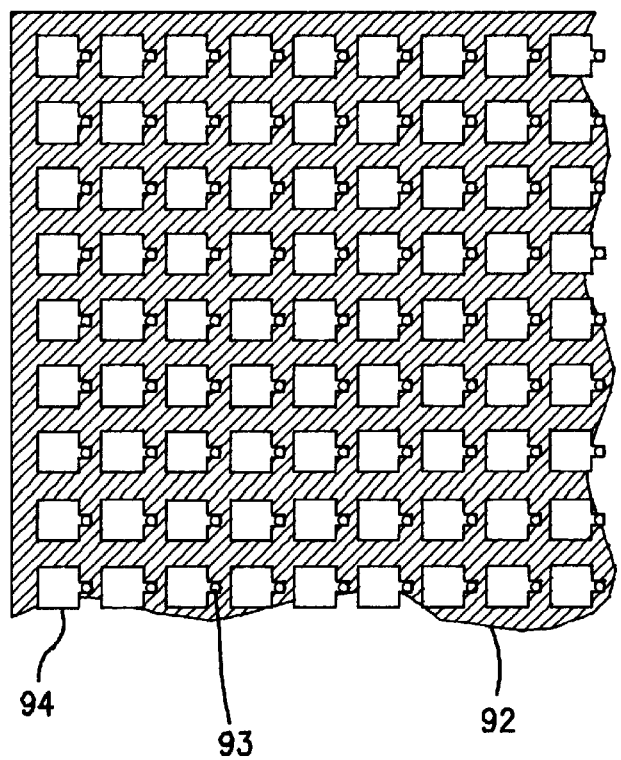
FIG. 13 is a fragmentary plane view illustrative of a second surface of an organic substrate with area bumps aligned in 16×16 matrix over the organic substrate in second and third embodiments according to the present invention.

A second embodiment according to the present invention will be described with reference to FIGS. 12 through 13.

A silicon wafer was prepared which has first and second surfaces coated with silicon dioxide films. The silicon wafer has a diameter of 6 inches and a thickness of 1 millimeter. A photo-resist is applied on the silicon wafer and then patterned to form a photo-resist pattern on the silicon wafer. By use of the photo-resist pattern, patterns of openings are formed in the silicon wafer so that the openings are aligned in matrix at a constant pitch over the silicon wafer. The silicon wafer is then subjected to a hydrofluoric acid solution for 10 minutes. The used photo-resist film is removed from the silicon wafer before the silicon wafer is then subjected to an alkyl solution such as a solution containing 30% of potassium hydroxide for 30 minutes so that (111)-faces are shown and square-pyramid pits are formed in the first surface of the silicon wafer. The square-pyramid pits are aligned in a matrix. A metal thin film is formed on the wafer by sputtering. The silicon wafer is then subjected to a nickel plating to form a nickel film having a thickness of 5 millimeters over the silicon wafer so that the shapes of the pits are transcribed. By use of the nickel plated film as a template, a mold releasing agent is applied and gold sputtering and nickel plating are then carried out for preparation of a template of the silicon wafer for the injection mold A pin die is assembled on the first surface of the silicon wafer as one template so that the square-pyramid pits face to the pin die. Pins are provided on the pin die so that the pins extend between the pin die and the first surface of the silicon wafer. Each of the pins has a diameter of 0.2 millimeters and a length of 1 millimeters. The pins are aligned in 16×16 matrix at the same pitch of 0.5 millimeters as the square-pyramid pits so that each of the pins is positioned to be adjacent to one side of the corresponding one of the square-pyramid pits. The pin die assembly is used for an injection molding of ABS resin so that an organic substrate 92 of 10 mm×10 mm is formed. As illustrated in FIG. 12, the first surface of the organic substrate 92 has through holes 93 at the same position as the pins and square-pyramid bumps 91 at the same position as the square-pyramid pits. As illustrated in FIG. 13, the second surface of the organic substrate 92 has through holes 93 at the same position as the pins and ball grid arrays 94 at the same position as the square-pyramid pits. The through holes 93 are aligned in 16×16 matrix at a pitch of 0.5 millimeters. The square-pyramid bumps 91 are also aligned in 16×16 matrix at the same pitch of 0.5 millimeters so that each of the through holes 93 is positioned adjacent to one side of the corresponding one of the square-pyramid bumps 91. The ball grid arrays 94 are also aligned in 16×16 matrix at the same pitch of 0.5 millimeters so that each of the through holes 93 is positioned adjacent to one side of the corresponding one of the ball grid arrays 94. The existence of the pins results in formation of the through holes 93. Burrs are formed on the organic substrate 92 when the through holes 93 are formed. The burrs are removed by YAG pulse laser. The organic substrate 92 has a thickness of 1 millimeter and a size of 10 mm×10 mm. Each square-pyramid bump 91 has a top slightly rounded. Surfaces of the organic substrate 92 are treated by a plasma etcher for 5 minutes. Photo-resist patterns are formed on both surfaces of the organic substrate 92 by a photo-lithography. The organic substrate 92 is then subjected to an electroless plating of copper to form copper plated films having a thickness of 10 micrometers. The organic substrate 92 is then subjected to an electroless plating of nickel to form nickel plated films having a thickness of 2 micrometers. The organic substrate 92 is then subjected to an electroless plating of gold to form gold plated films having a thickness of 0.5 micrometers. The used photo-resist films are removed from the first and second surfaces of the organic substrate 92. A photo-sensitive epoxy resin is applied on the first and second surfaces of the organic substrate 92 and then patterned so that the photo-sensitive epoxy resin patterns extend over both the first and second surfaces of the organic substrate 92 except over the square-pyramid bumps 91 and the ball grid arrays 94. The square-pyramid bumps 91 and the ball grid arrays 94 are subjected to a nickel plating and subsequent indium 50 wt %-tin 50 wt % plating to form laminations of a nickel plating film having a thickness of 2 micrometers and an indium 50 wt %-tin 50 wt % plating film having a thickness of 10 micrometers which coat the square-pyramid bumps 91 and the ball grid arrays 94.

An IC chip with electrodes which have been nickel-plated and gold-plated is aligned on the organic substrate 92. The combined IC chip and the organic substrate 92 are then heated at 150° C. and pressed at 20 g for each contact for bonding the same. A space between the combined IC chip 25 and the organic substrate 92 and spaces of the through holes are filled by a dispenser with a sealing resin which comprises 30 wt % of epoxy resin and 70 wt % of silica filler. The combined IC chip and the organic substrate 92 are once heated at 150° C. and then remain for 30 minutes to cure the sealing resin. The heating causes melted indium-tin and gold to be inter-diffused whereby a melting point of the metal is increased to prevent the melting of the contact even heated for curing the sealing resin.

It was confirmed that of the IC package a resistance between the wiring of the substrate to the electrode of the IC is extremely low, for example, 10 m Ω or less. The TC package was subjected to a thermal cycle test of 500 times between −40° C. and 125° C. The IC package was not broken. The external shape almost remains unchanged between 8 mm×8 mm and 10 mm×10 mm. This means that the size reduction is possible. Since the ball grid arrays 94 are aligned at a pitch of 0.5 millimeters in 16×16 matrix, the IC package with 256 pins and small size is obtained.

THIRD EMBODIMENT

A third embodiment according to the present invention will be described with reference to FIGS. 12 through 13.

A silicon wafer was prepared which has first and second surfaces coated with silicon dioxide films The silicon wafer has a diameter of 6 inches and a thickness of 1 millimeter. A photo-resist is applied on the silicon wafer and then patterned to form a photo-resist pattern on the silicon wafer. By use of the photo-resist pattern, patterns of openings are formed in the silicon wafer so that the openings are aligned in matrix at a constant pitch over the silicon wafer. The silicon wafer is then subjected to a hydrofluoric acid solution for 10 minutes. The used photo-resist film is removed from the silicon wafer before the silicon wafer is then subjected to an alkyl solution such as a solution containing 30% of potassium hydroxide for 30 minutes so that (111)-faces are shown and square-pyramid pits are formed in the first surface of the silicon wafer. The square-pyramid pits are aligned in matrix. A metal thin film is formed by sputtering method over the silicon wafer. The silicon wafer is then subjected to a nickel plating to form a nickel film having a thickness of 5 millimeters over the silicon wafer so that the shapes of the pits are transcribed. By use of the nickel plated film as a template, a mold releasing agent is applied and gold sputtering and nickel plating are then carried out for preparation of a template of the silicon wafer for the injection mold.

A pin die is assembled on the first surface of the silicon wafer as one template so that the square-pyramid pits face to the pin die. Pins are provided on the pin die so that the pins extend between the pin die and the first surface of the silicon wafer. Each of the pins has a diameter of 0.2 millimeters and a length of 1 millimeters. The pins are aligned in 16×16 matrix at the same pitch of 0.5 millimeters as the square-pyramid pits so that each of the pins is positioned to be adjacent to one side of the corresponding one of the square-pyramid pits. The pin die assembly is used for an injection molding of ABS resin so that an organic substrate 92 of 10 mm×10 mm is formed. The organic substrate 92 is polished to have a thickness of 0.3 millimeters. As illustrated in FIG. 12, the first surface of the organic substrate 92 has through holes 93 at the same position as the pins and square-pyramid bumps 91 at the same position as the square-pyramid pits. As illustrated in FIG. 13, the second surface of the organic substrate 92 has through holes 93 at the same position as the pins and ball grid arrays 94 at the same position as the square-pyramid pits. The through holes 93 are aligned in 16×16 matrix at a pitch of 0.5 millimeters. The square-pyramid bumps 91 are also aligned in 16×16 matrix at the same pitch of 0.5 millimeters so that each of the through holes 93 is positioned adjacent to one side of the corresponding one of the square-pyramid bumps 91. The ball grid arrays 94 are also aligned in 16×16 matrix at the same pitch of 0.5 millimeters so that each of the through holes 93 is positioned adjacent to one side of the corresponding one of the ball grid arrays 94. The existence of the pins results in formation of the through holes 93. Burrs are formed on the organic substrate 92 when the through holes 93 are formed. The burrs are removed by YAG pulse laser. The organic substrate 92 has a thickness of 1 millimeter and a size of 10 mm×10 mm. Each square-pyramid bump 91 has a top slightly rounded. Surfaces of the organic substrate 92 are treated by a plasma etcher for 5 minutes. Photo-resist patterns are formed on both surfaces of the organic substrate 92 by a photo-lithography. The organic substrate 92 is then subjected to an electroless plating of copper to form copper plated films having a thickness of 10 micrometers. The organic substrate 92 is then subjected to an electroless plating of nickel to form nickel plated films having a thickness of 2 micrometers. The organic substrate 92 is then subjected to an electroless plating of gold to form gold plated films having a thickness of 0.5 micrometers. The used photo-resist films are removed from the first and second surfaces of the organic substrate 92. A photo-sensitive epoxy resin is applied on the first and second surfaces of the organic substrate 92 and then patterned so that the photo-sensitive epoxy resin patterns extend over both the first and second surfaces of the organic substrate 92 except over the square-pyrarmid bumps 91 and the ball grid arrays 94. The square-pyramid bumps 91 and the ball grid arrays 94 are subjected to a nickel pleating and subsequent indium 50 wt %-tin 50 wt % plating to form laminations of a nickel plating film having a thickness of 2 micrometers and an indium 50 wt %-tin 50 wt % plating film having a thickness of 10 micrometers which coat the square-pyramid bumps 91 and the ball grid arrays 94.

An IC chip is polished to have a thickness of 0.2 millimeters and the formed with electrodes which have been nickel-plated and gold-plated is aligned on the organic substrate 92. The combined IC chip and the organic substrate 92 are then heated at 150° C. and pressed at 20 g for each contact for bonding the same. A space between the combined IC chip 25 and the organic substrate 92 and spaces of the through holes are filled by a dispenser with a sealing resin which comprises 30 wt % of epoxy resin and 70 wt % of silica filler. The combined IC chip and the organic substrate 92 are once heated at 150° C. and then remain for 30 minutes to cure the sealing resin. The heating causes melt indium-tin and gold to be inter-diffused whereby a melting point of the metal is increased to prevent the melting of the contact even heated for curing the sealing resin.

It was confirmed that of the IC package a resistance between the wiring of the substrate to the electrode of the IC is extremely low, for example, 10 m Ω or less. The IC package was subjected to a thermal cycle test of 500 times between −40° C. and 125° C. The IC package was not broken. The external shape almost remains unchanged between 8 mm×8 mm and 10 mm×10 mm. This means that tie size reduction is possible. Since the ball grid arrays 94 are aligned at a pitch of 0.5 millimeters in 16×16 matrix, the IC package with 256 pins and small size is obtained.

FOURTH EMBODIMENT

Figure 14:
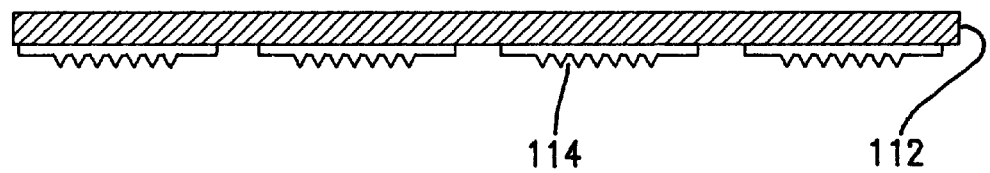
FIG. 14 is a fragmentary plane view illustrative of IC probes formed on a multilevel interconnection substrate in fourth and fifth embodiments according to the present invention.

A fourth embodiment according to the present invention will be described with reference to FIG.14.

A silicon wafer was prepared which has first and second surfaces coated with silicon dioxide films. The silicon wafer has a diameter of 6 inches and a thickness of 1 millimeter. A photo-resist is applied on the silicon wafer and then patterned to form a photo-resist pattern on the silicon wafer. By use of the photo-resist pattern, patterns of openings are formed in the silicon wafer so that the openings are aligned in matrix at a constant pitch over the silicon wafer. The silicon wafer is then subjected to a hydrofluoric acid solution for 10 minutes. The used photo-resist film is removed from the silicon wafer before the silicon wafer is then subjected to an alkyl solution such as a solution containing 30% of potassium hydroxide for 30 minutes so that (111)-faces are shown and square-pyramid pits are formed in the first surface of the silicon wafer. The square-pyramid pits are aligned in matrix. A metal thin film is formed by sputtering method over the silicon wafer. The silicon wafer is then subjected to a nickel plating to form a nickel film having a thickness of 5 millimeters over the silicon wafer so that the shapes of the pits are transcribed. By use of the nickel plated film as a template, a mold releasing agent is applied and gold sputtering and nickel plating are then carried out for preparation of a template of the silicon wafer for the injection mold.

A pin die is assembled on the first surface of the silicon wafer as one template so that the square-pyramid pits face to the pin die. Pins are provided on the pin die so that the pins extend between the pin die and the first surface of the silicon wafer. Each of the pins has a diameter of 0.2 millimeters and a length of 1 millimeters. The pins are aligned in matrix at the same pitch of 0.5 millimeters as the square-pyramid pits so that each of the pins is positioned to be adjacent to one side of the corresponding one of the square-pyramid pits. The pin die assembly is used for an injection molding of ABS resin so that an organic substrate of 10 mm×10 mm is formed. The first surface of the organic substrate has through holes at the same position as the pins and square-pyramid bumps at the same position as the square-pyramid pits. The second surface of the organic substrate has through holes at the same position as the pins and ball grid arrays at the same position as the square-pyramid pits. The through holes are aligned in matrix at a pitch of 0.5 millimeters. The square-pyramid bumps are also aligned in matrix at the same pitch of 0.5 millimeters so that each of the through holes is positioned adjacent to one side of the corresponding one of the square-pyramid bumps. The ball grid arrays are also aligned in matrix at the same pitch of 0.5 millimeters so that each of the through holes is positioned adjacent to one side of the corresponding one of the ball grid arrays. The existence of the pins results in formation of the through holes. Burrs are formed on the organic substrate when the through holes are formed. The burrs are removed by YAG pulse laser. The organic substrate has a thickness of 1 millimeter and a size of 10 mm×10 mm. Each square-pyramid bump has a top slightly rounded. Surfaces of the organic substrate are treated by a plasma etcher for 5 minutes. Photo-resist patterns are formed on both surfaces of the organic substrate by a photo-lithography. The organic substrate is then subjected to an electroless plating of copper to form copper plated films having a thickness of 10 micrometers. The organic substrate is then subjected to an electroless plating of nickel to form nickel plated films having a thickness of 5 micrometers. The organic substrate is then subjected to an electroless plating of gold to form gold plated films having a thickness of 1 micrometer. The used photo-resist films are removed from the first and second surfaces of the organic substrate. A photo-sensitive epoxy resin is applied on the first and second surfaces of the organic substrate and then patterned so that the photo-sensitive epoxy resin patterns extend over both the first and second surfaces of the organic substrate except over the square-pyramid bumps and the ball grid arrays. The square-pyramid bumps and the ball grid arrays are subjected to a nickel plating and subsequent indium 50 wt %-tin 50 wt % plating to form laminations of a nickel plating film having a thickness of 2 micrometers and an indium 50 wt %-tin 50 wt % plating film having a thickness of 10 micrometers which coat the square-pyramid bumps and the ball grid arrays. As a result, IC probes 114 are then formed.

The IC probes 114 are provided on a multilevel interconnection substrate 112 for testing IC with gold electrodes. More than 500000 times contact life time at 10 g for each contact and a contact resistance of not more than 0.1 Ω were confirmed.

FIFTH EMBODIMENT

A fifth embodiment according to the present invention will be described with reference to FIG. 14.

A silicon wafer was prepared which has first and second surfaces coated with silicon dioxide films. The silicon wafer has a diameter of 6 inches and a thickness of 1 millimeter. A photo-resist is applied on the silicon wafer and then patterned to form a photo-resist pattern on the silicon wafer. By use of the photo-resist pattern, patterns of openings are formed in the silicon wafer so that the openings are aligned in matrix at a constant pitch over the silicon wafer. The silicon wafer is then subjected to a hydrofluoric acid solution for 10 minutes. The used photo-resist film is removed from the silicon wafer before the silicon wafer is then subjected to an alkyl solution such as a solution containing 30% of potassium hydroxide for 30 minutes so that (111)-faces are shown and square-pyramid pits are formed in the first surface o f the silicon wafer. The square-pyramid pits are aligned in matrix. A metal thin film is formed by sputtering method over the silicon wafer. The silicon wafer is then subjected to a nickel plating to form a nickel film having a thickness of 5 millimeters over the silicon wafer so that the shapes of the pits are transcribed. By use of the nickel plated film as a template, a mold releasing agent is applied and gold sputtering and nickel plating are then carried out for preparation of a template of the silicon wafer for the injection mold.

A pin die is assembled on the first surface of the silicon wafer as one template so that the square-pyramid pits face to the pin die. Pins are provided on the pin die so that the pins extend between the pin die and the first surface of the silicon wafer. Each of the pins has a diameter of 0.2 millimeters and a length of 1 millimeters. The pins are aligned in matrix at the same pitch of 0.5 millimeters as the square-pyramid pits so that each of the pins is positioned to be adjacent to one side of the corresponding one of the square-pyramid pits. The pin die assembly is used for an injection molding of ABS resin so that an organic substrate of 10 mm×10 mm is formed. The first surface of the organic substrate has through holes at the same position as the pins and square-pyramid bumps at the same position as the square-pyramid pits. The second surface of the organic substrate has through holes at the same position as the pins and ball grid arrays at the same position as the square-pyramid pits. The through holes are aligned in matrix at a pitch of 0.5 millimeters. The square-pyramid bumps are also aligned in matrix at the same pitch of 0.5 millimeters so that each of the through holes is positioned adjacent to one side of the corresponding one of the square-pyramid bumps. The ball grid arrays are also aligned in matrix at the sane pitch of 0.5 millimeters so that each of the through holes is positioned adjacent to one side of the corresponding one of the ball grid arrays. The existence of the pins results in formation of the through holes. Burrs are formed on the organic substrate when the through holes are formed. The burrs are removed by YAG pulse laser. The organic substrate has a thickness of 1 millimeter and a size of 10 mm×10 mm. Each square-pyramid bump has a top slightly rounded. Surfaces of the organic substrate are treated by a plasma etcher for 5 minutes. Photo-resist patterns are formed on both surfaces of the organic substrate by a photo-lithography. The organic substrate is then subjected to an electroless plating of copper to form copper plated films having a thickness of 10 micrometers. The organic substrate is then subjected to an electroless plating of nickel to form nickel plated films having a thickness of 5 micrometers. The organic substrate is then subjected to an electroless plating of ruthenium to form ruthenium plated films having a thickness of 1 micrometer. The used photo-resist films are removed from the first and second surfaces of the organic substrate. A photo-sensitive epoxy resin is applied on the first and second surfaces of the organic substrate and then patterned so that the photo-sensitive epoxy resin patterns extend over both the first and second surfaces of the organic substrate except over the square-pyramid bumps and the ball grid arrays. The square-pyramid bumps and the ball grid arrays are subjected to a nickel plating and subsequent indium 50 wt %-tin 50 wt % plating to form laminations of a nickel plating film having a thickness of 2 micrometers and an indium 50 wt %-tin 50 wt % plating film having a thickness of 10 micrometers which coat the square-pyramid bumps and the ball grid arrays. As a result, IC probes 114 are then formed.

The IC probes 114 are provided on a multilevel interconnection substrate 112 for testing IC with gold electrodes. More than 500,000 times contact life time at 10 g for each contact and a contact resistance of not more than 0.1 Ω were confirmed.

SIXTH EMBODIMENT

Figure 15:
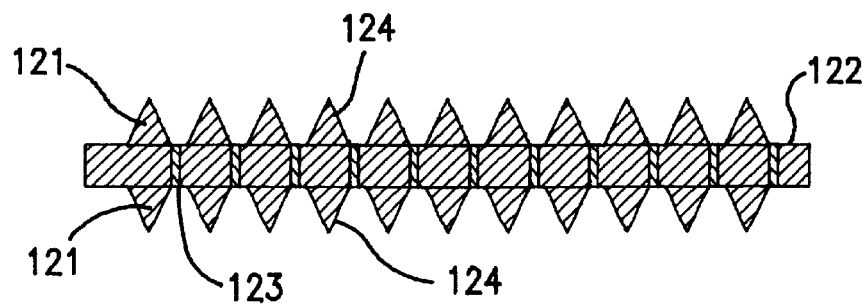
FIG. 15 is a fragmentary cross sectional elevation view illustrative of first and second square-pyramid bumps arrays formed on both first and second surfaces of an organic substrate in sixth, seventh and eighth embodiments according to the present invention.

A sixth embodiment according to the present invention will be described with reference to FIGS. 15 and 16.

A silicon wafer was prepared which has first and second surfaces coated with silicon dioxide films. The silicon wafer has a diameter of 6 inches and a thickness of 1 millimeter. A photo-resist is applied on the silicon wafer 5 and then patterned to form a photo-resist pattern on the silicon wafer. By use of the photo-resist pattern, patterns of openings are formed in the silicon wafer so that the openings are aligned in the form of rectangles which are aligned in matrix separately from each other at a small distance wherein each rectangle has four sides each of which comprises an alignment of the openings. The silicon wafer is then subjected to a hydrofluoric acid solution for 10 minutes. The used photo-resist film is removed from the silicon wafer before the silicon wafer 5 is then subjected to a solution containing 30% of potassium hydroxide for 30 minutes so that (111)- faces are shown and square-pyramid pits are formed in the first surface of the silicon wafer. Each of the pits has an opening area of 100 μm×100 μm at the first surface of the silicon wafer and a depth of 70.8 μm. The square-pyramid pits are aligned in matrix. Two of the above silicon wafers were prepared for use as templates to carry out an injection molding of ABS resin so that an organic substrate 122 is formed as illustrated in FIG. 15. At this stage, the organic substrate 122 has no through holes. A first surface of the organic substrate has a first square-pyramid bump array 121 at the same position as the first square-pyramid pit array. A second surface of the organic substrate has a second square-pyramid bump array 121 at the same position as the second square-pyramid pit array. Through holes 123 are formed in the organic substrate 122 by a laser. Each square-pyramid bump 121 has a top slightly rounded. The height of the square-pyramid bump 121 is 60 micrometers. Both the first and second surfaces of the organic substrate 122 are treated by a plasma etcher for 5 minutes. A photo-sensitive epoxy resin is applied on both the first and second surfaces of the organic substrate 122 and then patterned so that the photo-sensitive epoxy resin patterns extend over the first and second surfaces of the organic substrate 122 except over the first and second square-pyramid bump arrays 121. The first and second square-pyramid bump arrays 121 are subjected to a nickel plating and subsequent indium 50 wt %-tin 50 wt % plating to form laminations of a nickel plating film and an indium 50 wt %-tin 50 wt % plating film which coat each of the first and second square-pyramid bump arrays 121. As a result, the organic substrate 122 is formed which has the first and second surfaces on which the first and second square-pyramid bump arrays 121 are formed respectively as illustrated in FIG. 15.

The above organic substrate 122 is provided between first and second glass epoxy substrates 132 which have first and second electrode arrays 135 so that the first square-pyramid bump array 121 formed on the first surface of the organic substrate 122 are in contact with the first electrode array 135 of the first glass epoxy substrate 132 whilst the second square-pyramid bump array 121 formed on the second surface of the organic substrate 122 are in contact with the second electrode array 135 of the second glass epoxy substrate 132. The above organic substrate 122 with the first and second square-pyramid bump arrays 121 is used as a connector for connecting the first electrode array 135 of the first glass epoxy substrate 132 and the second electrode array 135 of the second glass epoxy substrate 132.

SEVENTH EMBODIMENT

A seventh embodiment according to the present invention will be described with reference to FIGS. 15 and 16.

A silicon wafer was prepared which ha,s first and second surfaces coated with silicon dioxide films. The silicon wafer has a diameter of 6 inches and a thickness of 1 millimeter. A photo-resist is applied on the silicon wafer 5 and then patterned to form a photo-resist pattern on the silicon wafer. By use of the photo-resist pattern, patterns of openings are formed in the silicon wafer so that the openings are aligned in the form of rectangles which are aligned in matrix separately from each other at a small distance wherein each rectangle has four sides each of which comprises an alignment of the openings. The silicon water is then subjected to a hydrofluoric acid solution for 10 minutes. The used photo-resist film is removed from the silicon wafer before the silicon wafer 5 is then subjected to a solution containing 30% of potassium hydroxide for 30 minutes so that (111)- faces are shown and square-pyramid pits are formed in the first surface of the silicon wafer. Each of the pits has an opening area of 100 μm×100 μm at the first surface of the silicon wafer and a depth of 70.8 μm. The square-pyramid pits are aligned in matrix. Two of the above silicon wafer were prepared for use as templates to carry out an injection molding of liquid crystal polymer resin so that an organic substrate 122 is formed as illustrated in FIG. 15. At this stage, the organic substrate 122 has no through holes. A first surface of the organic substrate has a first square-pyramid bump array 121 at the same position as the first square-pyramid pit array. A second surface of the organic substrate has a second square-pyramid bump array 121 at the same position as the second square-pyramid pit array. Through holes 123 are formed in the organic substrate 122 by a laser. Each square-pyramid bump 121 has a top slightly rounded. The height of the square-pyramid bump 121 is 60 micrometers. Both the first and second surfaces of the organic substrate 122 are treated by a plasma etcher for 5 minutes. A photo-sensitive epoxy resin is applied on both the first and second surfaces of the organic substrate 122 and then patterned so that the photo-sensitive epoxy resin patterns extend over the first and second surfaces of the organic substrate 122 except over the first and second square-pyramid bump arrays 121. The first and second square-pyramid bump arrays 121 are subjected to a nickel plating and subsequent indium 50 wt %-tin 50 wt % plating to form laminations of a nickel plating film and an indium 50 wt %-tin 50 wt % plating film which coat each of the first and second square-pyramid bump arrays 121. As a result, the organic substrate 122 is formed which has the first and second surfaces on which the first and second square-pyramid bump arrays 121 are formed respectively as illustrated in FIG. 15.

The above organic substrate 122 is provided between first and second glass epoxy substrates 132 which have first and second electrode arrays 135 so that the first square-pyramid bump array 121 formed on the first surface of the organic substrate 122 are in contact with the first electrode array 135 of the first glass epoxy substrate 132 whilst the second square-pyramid bump array 121 formed on the second surface of the organic substrate 122 are in contact with the second electrode array 135 of the second glass epoxy substrate 132. The above organic substrate 122 with the first and second square-pyramid bump arrays 121 is used as a connector for connecting the first electrode array 135 of the first glass epoxy substrate 132 and the second electrode array 135 of the second glass epoxy substrate 132.

More than 500000 times contact life time at 30 g for each contact and a contact resistance of not more than 0.05 Ω were confirmed.

EIGHTH EMBODIMENT

An eighth embodiment according to the present invention will be described with reference to FIGS. 15 and 16.

A silicon wafer was prepared which has first and second surfaces coated with silicon dioxide films. The silicon wafer has a diameter of 6 inches and a thickness of 1 millimeter A photo-resist is applied on the silicon wafer 5 and then patterned to form a photo-resist pattern on the silicon wafer. By use of the photo-resist pattern, patterns of openings are formed in the silicon wafer so that the openings are aligned in the form of rectangles which are aligned in matrix separately from each other at a small distance wherein each rectangle has four sides each of which comprises an alignment of the openings. The silicon wafer is then subjected to a hydrofluoric acid solution for 10 minutes. The used photo-resist film is removed from the silicon wafer before the silicon wafer 5 is then subjected to a solution containing 30% of potassium hydroxide for 30 minutes so that (111)-faces are shown and square-pyramid pits are formed in the first surface of the silicon wafer. Each of the pits has an opening area of 100 $\mu$m×100 $\mu$m at the first surface of the silicon wafer and a depth of 70.8 $\mu$m. The square-pyramid pits are aligned in matrix. Two of the above silicon wafer were prepared for use as templates to carry out an injection molding of elastomer so that an organic substrate 122 is formed as illustrated in FIG. 15. At this stage, the organic substrate 122 has no through holes. A first surface of the organic substrate has a first square-pyramid bump array 121 at the same position as the first square-pyramid pit array. A second surface of the organic substrate has a second square-pyramid bump array 121 at the same position as the second square-pyramid pit array. Through holes 123 are formed in the organic substrate 122 by a laser. Each square-pyramid bump 121 has a top slightly rounded. The height of the square-pyramid bump 121 is 60 micrometers. Both the first and second surfaces of the organic substrate 122 are treated by a plasma etcher for 5 minutes. A photo-sensitive epoxy resin is applied on both the first and second surfaces of the organic substrate 122 and then patterned so that the photo-sensitive epoxy resin patterns extend over the first and second surfaces of the organic substrate 122 except over the first and second square-pyramid bump arrays 121. The first and second square-pyramid bump arrays 121 are subjected to a nickel plating and subsequent indium 50 wt %-tin 50 wt % plating to form laminations of a nickel plating film and an indium 50 wt %-tin 50 wt % plating film which coat each of the first and second square-pyramid bump arrays 121. As a result, the organic substrate 122 is formed which has the first and second surfaces on which the first and second square-pyramid bump arrays 121 are formed respectively as illustrated in FIG. 15.

The above organic substrate 122 is provided between first and second glass epoxy substrates 132 which have first and second electrode arrays 135 so that the first square-pyramid bump array 121 formed on the first surface of the organic substrate 122 are in contact with the first electrode array 135 of the first glass epoxy substrate 132 whilst the second square-pyramid bump array 121 formed oil the second surface of the organic substrate 122 are in contact with the second electrode array 135 of the second glass epoxy substrate 132. The above organic substrate 122 with the first and second square-pyramid bump arrays 121 is used as a connector for connecting the first electrode array 135 of the first glass epoxy substrate 132 and the second electrode array 135 of the second glass epoxy substrate 132.

More than 500,000 times contact life time at 5 g for each contact and a contact resistance of not more than 0.1 Ω were confirmed.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. An IC package comprising:

an IC chip substrate having a first surface with a plurality of electrodes thereon;

an organic substrate having a first surface with a plurality of bump electrodes thereon that are aligned in a matrix, said organic substrate being combined with said IC chip substrate, each of said bump electrodes being in contact with a corresponding one of said electrodes on said IC chip substrate, said organic substrate having a plurality of through holes aligned in a matrix and positioned adjacent corresponding ones of said bump electrodes and first metallization patterns electrically connecting each of said bump electrodes to a corresponding one of said through holes; and said organic substrate having a second surface with a plurality of ball grid arrays that are aligned in a matrix in positions corresponding to said bums electrodes and adjacent corresponding ones of said through holes, said second surface having second metallization patterns electrically connecting each of said ball grid arrays to a corresponding one of said through holes.

2. The IC package as claimed in claim 1, wherein a space between said IC chip substrate and said organic substrate is filled with a sealing resin material.

3. The IC package as claimed in claim 1, wherein each of said bump electrodes has a pyramidal shape.

4. The IC package as claimed in claim 1, wherein each of said bump electrodes comprises a bump body which is made of the same material as said organic substrate and a metal film coating said bump body.

5. The IC package as claimed in claim 1, wherein said bump electrodes are aligned to form a rectangle having four sides, each of which comprises an alignment of said bump electrodes, said through holes are aligned outside and along said each side of said rectangle of said bump electrodes and said through holes are distanced from said bump electrodes and said metallization patterns provide electrical connections between each of said bump electrodes and the corresponding one of said through holes.

6. The IC package as claimed in claim 1, wherein said organic substrate is made of ABS resin.

7. The IC package as claimed in claim 1, wherein said organic substrate is made of liquid crystal polymer resin.

8. The IC package as claimed in claim 1, wherein said organic substrate is made of elastomer.

9. An IC probe card comprising:

a multilevel interconnection substrate;

a plurality of organic substrates provided on said multilevel interconnection substrate, each of said organic substrates having a first surface with a plurality of bump electrodes thereon that are aligned in a matrix for contacting electrodes of an IC chip, each said organic substrate having a plurality of through holes aligned in a matrix and positioned adjacent corresponding ones of said bump electrodes and first metallization patterns electrically connecting each of said bump electrodes to a corresponding one of said through holes; and each said organic substrate having a second surface with a plurality of ball grid arrays that are aligned in a matrix in positions corresponding to said bump electrodes and adjacent corresponding ones of said through holes, said second surface having second metallization patterns electrically connecting each of said ball grid arrays to a corresponding one of said through holes.

10. The IC probe card as claimed in claim 9, wherein a space between said IC chip substrate and said organic substrate is filled with a sealing resin material.

11. The IC probe card as claimed in claim 9, wherein each of said bump electrodes has a pyramidal shape.

12. The IC probe card as claimed in claim 9, wherein each of said bump electrodes comprises a bump body which is made of the same material as said organic substrate and a metal film coating said bump body.

13. The IC probe card as claimed in claim 9, wherein said bump electrodes are aligned to form a rectangle having four sides, each of which comprises an alignment of said bump electrodes, said through holes are aligned outside and along said each side of said rectangle of said bump electrodes and said through holes are distanced from said bump electrodes and said metallization patterns provide electrical connections between each of said bump electrodes and the corresponding one of said through holes.

14. The IC probe card as claimed in claim 9, wherein said organic substrate is made of ABS resin.

15. The IC probe card as claimed in claim 9, wherein said organic substrate is made of liquid crystal polymer resin.

16. The IC probe card as claimed in claim 9, wherein said organic substrate is made of elastomer.

* * * * *